United States Patent
Matsuzaki et al.

(10) Patent No.: US 12,146,059 B2
(45) Date of Patent: Nov. 19, 2024

(54) CURABLE SILICONE COMPOSITION, OPTICAL MEMBER RESIN SHEET COMPRISING SAME, AND LIGHT-EMITTING DEVICE

(71) Applicant: DOW TORAY CO., LTD., Tokyo (JP)

(72) Inventors: Mayumi Matsuzaki, Ichihara (JP); Masaaki Amako, Ichihara (JP); Kasumi Takeuchi, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 1282 days.

(21) Appl. No.: 16/648,340

(22) PCT Filed: Sep. 21, 2018

(86) PCT No.: PCT/JP2018/035051
§ 371 (c)(1),
(2) Date: Mar. 18, 2020

(87) PCT Pub. No.: WO2019/059351
PCT Pub. Date: Mar. 28, 2019

(65) Prior Publication Data
US 2020/0216671 A1 Jul. 9, 2020

(30) Foreign Application Priority Data
Sep. 21, 2017 (JP) .................. 2017-181167

(51) Int. Cl.
| | |
|---|---|
| C08L 83/04 | (2006.01) |
| C08G 77/00 | (2006.01) |
| C08J 5/18 | (2006.01) |
| C08L 83/00 | (2006.01) |
| C08L 83/08 | (2006.01) |
| H01L 33/50 | (2010.01) |
| H01L 33/56 | (2010.01) |
| H10K 50/844 | (2023.01) |

(52) U.S. Cl.
CPC .............. *C08L 83/04* (2013.01); *C08G 77/70* (2013.01); *C08G 77/80* (2013.01); *C08J 5/18* (2013.01); *C08L 83/00* (2013.01); *C08L 83/08* (2013.01); *H01L 33/502* (2013.01); *H01L 33/56* (2013.01); *H10K 50/844* (2023.02); *C08J 2383/08* (2013.01); *C08J 2483/04* (2013.01); *C08L 2203/206* (2013.01); *C08L 2205/025* (2013.01); *C08L 2205/03* (2013.01)

(58) Field of Classification Search
CPC .... H01L 33/56; H01L 23/296; C08L 2205/02; C08L 2205/025
See application file for complete search history.

(56) References Cited

U.S. PATENT DOCUMENTS

| | | |
|---|---|---|
| 2007/0293623 A1 | 12/2007 | Kashiwagi et al. |
| 2008/0308828 A1 | 12/2008 | Kashiwagi et al. |
| 2009/0236759 A1* | 9/2009 | Kashiwagi ............ H01L 23/296 525/478 |
| 2010/0213502 A1* | 8/2010 | Kashiwagi ............ C08G 77/20 257/E33.001 |
| 2013/0200413 A1 | 8/2013 | Kashiwagi et al. |
| 2014/0175488 A1 | 6/2014 | Kashiwagi et al. |
| 2015/0315427 A1 | 11/2015 | Yoshida et al. |
| 2016/0204319 A1* | 7/2016 | Swier ...................... C08K 5/56 428/339 |
| 2016/0208055 A1* | 7/2016 | Horstman ............ C09D 183/10 |

FOREIGN PATENT DOCUMENTS

| | | | |
|---|---|---|---|
| JP | 2008019424 A | 1/2008 | |
| JP | 2009235368 A | 10/2009 | |
| JP | 2014138999 A | 7/2014 | |
| JP | 2016504461 A | 2/2016 | |
| JP | 2016508290 A | 3/2016 | |
| JP | 2016536440 A | 11/2016 | |
| WO | 2016077159 A1 | 5/2016 | |
| WO | 2016022332 A1 | 11/2016 | |
| WO | WO-2019021926 A1 * | 1/2019 | ............... B05D 5/06 |
| WO | WO-2019022861 A1 * | 1/2019 | ............. C08G 77/20 |

OTHER PUBLICATIONS

English translation of International Search Report for PCT/JP2018/035051 dated Dec. 18, 2018, 2 pages.
Machine assisted English translation of JP2008019424A obtained from https://patents.google.com/patent on Mar. 18, 2020, 13 pages.

* cited by examiner

*Primary Examiner* — Marc S Zimmer
(74) *Attorney, Agent, or Firm* — WARNER NORCROSS + JUDD LLP

(57) ABSTRACT

A curable silicone composition is disclosed. The composition comprises: (A) a hydrosilylation-reactive resin-linear block copolymer type organopolysiloxane; (B) an organopolysiloxane resin containing a curing-reactive group having a carbon-carbon double bond in the molecule; (C) an organohydrogenpolysiloxane; and (D) a hydrosilylation reaction catalyst. An absolute value ($\Delta RI$) of a difference between refractive indices of component (A) and component (B) measured at room temperature is less than 0.05. The curable silicone composition generally has excellent handleability, moldability, and mechanical strength (hardness, in particular) and flexibility of a cured product while achieving high transparency. Also disclosed is a resin sheet for an optical member including the composition or cured product thereof, and a light-emitting device or the like including the composition or cured product thereof.

17 Claims, No Drawings

CURABLE SILICONE COMPOSITION, OPTICAL MEMBER RESIN SHEET COMPRISING SAME, AND LIGHT-EMITTING DEVICE

CROSS-REFERENCE TO RELATED APPLICATIONS

This application is the National Stage of International Appl. No. PCT/JP2018/035051 filed on 21 Sep. 2018, which claims priority to and all advantages of Japanese Appl. No. 2017-181167 filed on 21 Sep. 2017, the content of which is hereby incorporated by reference.

TECHNICAL FIELD

The present invention relates to a curable silicone composition having excellent handleability, moldability, and mechanical strength (hardness, in particular) and flexibility of a cured product while achieving high transparency, a resin sheet for an optical member including the same, and a laminate including the same. Further, the present invention relates to an optical member or light-emitting device including the curable silicone composition or a cured product thereof.

BACKGROUND ART

Solid silicone materials are utilized in a wide range of industrial fields due to their excellent moldability as well as heat resistance, cold resistance, electrical insulation, weather resistance, water repellency, and transparency. In particular, a cured product of a curable silicone composition is also suitable as a sealant for optical materials—in particular, light-emitting devices (inorganic or organic light-emitting diodes) because it is resistant to discoloration and exhibits minimal deterioration in physical properties in comparison to other organic materials.

In recent years, silicone-containing materials having hot melt properties, which are solid or semisolid at room temperature and melt when heated at a high temperature, have been proposed for production processes for new light-emitting devices. Unlike ordinary liquid materials, silicone-containing materials having hot melt properties have excellent handleability and uniform coating properties. For example, the present applicants have proposed, in Patent Document 1, an optical assembly in which a reactive or non-reactive silicone-containing hot-melt composition having a resinous siloxane structure and a linear siloxane structure in the molecule is used as a sealing material film. Similarly, Patent Document 2 proposes a curable silicone composition which is cured by a hydrosilylation reaction and contains a non-reactive organopolysiloxane resin.

The sealing material can be used in combination with a sealing material film (phosphor layer) having a high refractive index and having a fluorescent material that converts wavelengths from a light source so as to provide a light-emitting device having excellent productivity and light-emitting efficiency. In addition, this silicone-containing material can be easily molded into a sheet shape by removing the organic solvent, which makes it possible to provide a resin sheet for an optical member yielding excellent light-emitting device productivity, light extraction efficiency, physical properties, and durability.

However, when a resin sheet for an optical member containing the aforementioned silicone material having a resinous siloxane structure and a linear siloxane structure is used in the production of a light-emitting device, the hardness or flexibility of the sealing member formed from the resin sheet for an optical member or a cured product thereof is insufficient during a molding process such as compression molding, which may lead to problems such as cracking occurring in the sealing member or the sealing member peeling without conforming to the device.

On the other hand, it has also been proposed to add a non-reactive organopolysiloxane resin for the purpose of improving strength or adhesion (Patent Documents 2 and 3) or to add a disulfide compound as a stabilizer for the silicone material serving as a main agent (Patent Document 4). However, the use of these additives does not sufficiently improve the strength or flexibility as a sealing member for an optical device or the conformance to the device, and there is room for further improvement. In addition, these additives—the non-reactive organopolysiloxane resin, in particular—impart adhesiveness to the surface of the sheet or the cured product thereof and therefore enhance conformance, however, the compatibility with the silicone material serving as the main agent is insufficient. This not only causes gelling of the composition, but also has a negative effect on fluidity, which may diminish the flexibility of the sheet and the cured product thereof and cause cracking in the sealing member. Further, since the refractive index of the non-reactive organopolysiloxane resin differs from that of the silicone agent serving as the main agent, cloudiness or coloration may occur, which may lead to a decrease in transparency and light extraction efficiency. Therefore, there is a strong demand for a curable silicone composition having excellent handleability, having excellent hardness and flexibility of a cured product, and achieving high transparency.

PRIOR ART DOCUMENTS

Patent Documents

Patent Document 1: Japanese Unexamined Patent Application Publication (Translation of PCT Application) No. 2016-508290
Patent Document 2: WO 2016/022332
Patent Document 3: Japanese Unexamined Patent Application Publication (Translation of PCT Application) No. 2016-536440
Patent Document 4: WO 2016/077159

SUMMARY OF THE INVENTION

Problems to be Solved by the Invention

The present invention was conceived in order to solve the problems described above, and an object of the present invention is to provide a curable silicone composition having excellent handleability and moldability, having excellent hardness and flexibility of a cured product, and achieving high transparency without causing problems such as gelling, and to provide a resin sheet for an optical member including the same. Another object of the present invention is to provide a laminate including the resin sheet for an optical member, and an optical member or a light-emitting device containing the curable silicone composition or a cured product thereof.

Means for Solving the Problems

As a result of dedicated research, the present inventors discovered that the problems described above can be solved by using a curable silicone composition containing:

(A) 100 parts by mass of an organopolysiloxane having an arylsiloxane unit represented by $R^4SiO_{3/2}$ (where $R^4$ is an aryl group having from 6 to 14 carbon atoms) and a polydiorganosiloxane structure represented by $(R_2SiO_{2/2})_n$ (where R is an alkyl group having from 1 to 20 carbon atoms or an aryl group having from 6 to 14 atoms which may be substituted with a halogen atom, and n is a number in the range of from 3 to 1000) in the molecule, and having an average of one or more hydrosilylation-reactive groups in the molecule;

(B) from 1 to 200 parts by mass of an organopolysiloxane resin containing a curing-reactive group having a carbon-carbon double bond in the molecule;

(C) an organohydrogenpolysiloxane having at least two silicon-bonded hydrogen atoms in the molecule (in an amount in a range in which an amount of silicon-bonded hydrogen atoms in component (C) is not less than 0.2 mol per 1 mol of carbon-carbon double bonds in the composition); and (D) a catalytic amount of a hydrosilylation reaction catalyst;

wherein an absolute value (ΔRI) of a difference between refractive indices of component (A) and component (B) measured at room temperature is less than 0.05 and more preferably less than 0.02; and the present inventors thereby arrived at the present invention. The curable silicone composition described above preferably contains at least one type of (E) a phosphor or reflective material, and may be in a form of a liquid composition dispersed in an organic solvent or in a form of a solid composition obtained by removing an organic solvent. In addition, the composition is particularly preferably molded into a sheet shape.

Further, the present inventors discovered that the problems described above can be solved by a resin sheet for an optical member including the curable silicone composition described above, and the present inventors thereby arrived at the present invention. The resin sheet for an optical member may be provided with a structure in which a solid silicone material having optical functions or optical properties differing from those of the sheet is further disposed on the sheet.

Similarly, the present inventors discovered that the problems described above can be solved by a laminate containing the resin sheet for an optical member described above, and the present inventors thereby arrived at the present invention. The laminate is not particularly limited as long as the laminate is a structure in which a resin sheet for an optical member is laminated, and includes a structure such as a functional resin sheet or a light-emitting device. In addition, for purposes of handling and distributing the resin sheet for an optical member, the sheet includes a releasable laminate provided with a release layer facing the resin sheet for an optical member.

In addition, the present inventors discovered that the problems described above can be solved by:
an optical member including the curable silicone composition described above or a cured product thereof; and
a light-emitting device having a structure sealed by the curable silicone composition described above or a cured product thereof; and the present inventors thereby arrived at the present invention.

Effects of the Invention

The curable silicone composition of the present invention has excellent handleability and moldability and can form a cured product which has excellent hardness and flexibility and achieves high transparency without causing problems such as gelling. In addition, the curable silicone composition described above can be molded into a sheet shape to provide a resin sheet for an optical member exhibiting these advantageous properties. Further, the present invention can provide a laminate including the resin sheet for an optical member, and an optical member or a light-emitting device containing the curable silicone composition or a cured product thereof.

MODE FOR CARRYING OUT THE INVENTION

Curable Silicone Composition

First, the curable silicone composition of the present invention will be described. In order to solve the problems described above, the curable silicone composition of the present invention is a hydrosilylation reaction curable composition including a hydrosilylation-reactive resin-linear block copolymer type organopolysiloxane having both an arylsiloxane unit represented by $R^4SiO_{3/2}$ (T-branched unit or resin structure) and a polyorganosiloxane structure represented by $(R_2SiO_{2/2})_n$ (siloxane linear structure) in the molecule, and includes an organopolysiloxane resin containing a curing reactive group having a carbon-carbon double bond in the molecule, wherein the absolute value (ΔRI) of the difference in the refractive index relative to that of the resin-linear block copolymer type organopolysiloxane at room temperature is very small. By using an organopolysiloxane resin which is reactive and has a similar refractive index, it is possible to obtain a curable silicone composition which improves the mechanical strength (hardness, in particular) and flexibility of the cured product thereof and achieves high transparency.

Specifically, the curable silicone composition contains:

(A) 100 parts by mass of an organopolysiloxane having an arylsiloxane unit represented by $R^4SiO_{3/2}$ (where $R^4$ is an aryl group having from 6 to 14 carbon atoms) and a polydiorganosiloxane structure represented by $(R_2SiO_{2/2})_n$ (where R is an alkyl group having from 1 to 20 carbon atoms or an aryl group having from 6 to 14 atoms which may be substituted with a halogen atom, and n is a number in the range of from 3 to 1000) in the molecule, and having an average of one or more hydrosilylation-reactive groups in the molecule;

(B) from 1 to 200 parts by mass of an organopolysiloxane resin containing a curing-reactive group having a carbon-carbon double bond in the molecule;

(C) an organohydrogenpolysiloxane having at least two silicon-bonded hydrogen atoms in the molecule (in an amount in a range in which an amount of silicon-bonded hydrogen atoms in component (C) is not less than 0.2 mol per 1 mol of carbon-carbon double bonds in the composition); and (D) a catalytic amount of a hydrosilylation reaction catalyst;

wherein an absolute value (ΔRI) of a difference between refractive indices of component (A) and component (B) measured at room temperature is less than 0.05.

(Component (A))

Component (A) described above is a hydrosilylation-reactive resin-linear polymer type organopolysiloxane including a T unit having an aryl group, and has a high refractive index and hot melt properties. Therefore, a cured product can be formed by a hydrosilylation reaction together with component (B) or component (C) described below as a binder resin of a component such as a phosphor or a reflective material, and a cured product layer having a desired shape can be formed. In particular, component (A) is a component that is useful as a binder resin of a resin sheet for an optical member.

Such a component (A) has an arylsiloxane unit represented by $R^A SiO_{3/2}$ (where $R^A$ is an aryl group having from 6 to 14 carbon atoms) and a polydiorganosiloxane structure represented by $(R_2 SiO_{2/2})_n$ (where R is an alkyl group having from 1 to 20 carbon atoms or an aryl group having from 6 to 14 atoms which may be substituted with a halogen atom, and n is a number in the range of from 3 to 1000) in the molecule, and having an average of one or more hydrosilylation-reactive groups in the molecule.

Here, examples of aryl groups having from 6 to 14 carbon atoms include phenyl groups, tolyl groups, xylyl groups, naphthyl groups, and anthracenyl groups, and phenyl groups are preferable from the perspective of industrial production. In addition, examples of R include alkyl groups such as methyl groups, ethyl groups, propyl groups, butyl groups, pentyl groups, hexyl groups, heptyl groups, octyl groups, nonyl groups, decyl groups, undecyl groups, and dodecyl group; aryl groups such as phenyl groups, tolyl groups, xylyl groups, naphthyl groups, and anthracenyl groups; and groups in which some or all of the hydrogen atoms bonded to these groups are substituted with halogen atoms such as fluorine atoms, chlorine atoms, or bromine atoms; and methyl groups or phenyl groups are preferable from the perspective of industrial production.

In addition, separate from the siloxane structure described above, component (A) has an average of one or more, and preferably two or more, hydrosilylation-reactive groups in the molecule. Here, the hydrosilylation-reactive group is a curing-reactive group having a carbon-carbon double bond in the molecule or a silicon-bonded hydrogen atom. Each of these forms a cured product as the entire composition by a hydrosilylation-reaction in the presence of component (D) and component (C) described below in the case of the former and component (B) described below in the case of the latter. Specifically, the curing-reactive group having a carbon-carbon double bond in the molecule is an alkenyl group or an acrylic group, and examples thereof include alkenyl groups having from 2 to 10 carbon atoms such as vinyl groups, allyl groups, butenyl groups, pentenyl groups, hexenyl groups, and heptenyl groups; and acrylic group-containing monovalent organic groups such as 3-methacryloxypropyl groups and 3-acryloxypropyl groups. Vinyl groups or hexenyl groups are particularly preferable. From the perspective of industrial production, the hydrosilylation-reactive group may be an alkenyl group having from 2 to 10 carbon atoms such as a vinyl group.

More specifically, component (A) is preferably a resin-linear organopolysiloxane block polymer having a structure in which (i) a resin structure block having siloxane unit represented by a T unit: $R^1 SiO_{3/2}$ (where $R^1$ is a monovalent organic group, a hydroxyl group, or an alkoxy group having from 1 to 6 carbon atoms, and at least one out of all of the $R^1$ moieties in the molecule is an aryl group having from 6 to 14 carbon atoms) and an optional Q unit: $SiO_{4/2}$; and (ii) a linear structure block represented by $(R_2 SiO_{2/2})_n$ (where n is the same number as described above, and R is the same group as described above) are linked by a silalkylene bond or a Si—O—Si bond; and having an $R^A SiO_{3/3}$ unit; wherein in the silalkylene bond or Si—O—Si bond that links the resin structure block and the linear structure block in the polymer, the Si atoms bonded to the resin structure constitute the $R^A SiO_{3/2}$ unit. In addition, component (A) is characterized in that it necessarily has an organosiloxy unit having at least one hydrosilylation-reactive group. Such an organosiloxy unit is one or more types of organosiloxy units selected from triorganosiloxy units ($M^{RB}$ units), diorganosiloxy units ($D^{RB}$ units), and monoorganosiloxy units ($T^{RB}$ units) including the hydrosilylation-reactive groups described above, and the number of organosiloxy units having hydrosilylation-reactive groups occupying the molecule of component (A) is preferably in the range of from 0.1 mol % to 5.0 mol % of all siloxy units in component (A). Note that in addition to the diorganosiloxy unit constituting the linear structure block, component (A) may also include a triorganosiloxy unit ($M^R$ unit) or a monoorganosiloxy unit ($T^R$) having a functional group R in the molecule.

The resin structure block in component (A) is a partial structure that imparts hot melt properties to the entire component (A), and is a resinous organopolysiloxane structure. This structure forms a partial structure formed from a resinous organopolysiloxane containing an arylsiloxane unit represented by $R^A SiO_{3/2}$ as an essential unit and containing multiple T units or Q units bonded to one another. In particular, when multiple aryl groups such as phenyl groups are included in the molecule, the refractive index of component (A) can be increased. Preferably, component (A) is an organopolysiloxane containing an arylsiloxane unit represented by $R^A SiO_{3/2}$ (where $R^A$ is the same group as described above) in an amount of from 20 to 80 mass % of the entire organopolysiloxane, and from the perspectives of the hot melt properties and the refractive index described above, the resin structure is particularly preferably formed substantially solely from the arylsiloxane unit represented by $R^A SiO_{3/2}$.

The linear structure is a non-reactive block represented by $R_2 SiO_{2/2})_n$, and is a structure in which at least 3 and preferably at least 5 diorganosiloxy units represented by $R_2 SiO_{2/2}$ are linked in a chain. This linear structure block is a partial structure which imparts moderate flexibility to the solid layer and the cured product layer formed by the copolymer. In the formula, n is the degree of polymerization of the diorganosiloxy unit constituting the partial structure, which is preferably in the range of from 5 to 250, and more preferably in the range of from 5 to 250, from 50 to 250, or from 100 to 250. When n in the partial structure exceeds the above upper limit, the properties as a linear molecule derived from the linear structure are strongly expressed, and the film-forming properties may be diminished in some cases. On the other hand, when n is less than the lower limit described above, the properties as a linear molecule are insufficient. In particular, when applied in the form of a film, cissing becomes likely to occur, and it may not be possible to apply the product uniformly, or the mechanical strength of the cured product may be insufficient.

The functional group R on the diorganosiloxy unit constituting the linear structure is an alkyl group or an aryl group, and these must be non-reactive with respect to the resin structure and the functional group in the same molecule and must maintain the linear structure without causing a polymerization such as a condensation reaction in the molecule. The alkyl group and the aryl group are the same groups as described above, and a methyl group or a phenyl group is preferable from an industrial point of view.

The resin structure block and the linear structure block in component (A) are preferably linked by a silalkylene bond derived from a hydrosilylation reaction between an alkenyl group and a silicon-bonded hydrogen atom, or a Si—O—Si bond derived from a condensable reaction group at the end of the resin structure or the linear structure. In particular, in the present invention, it is particularly preferable for the Si atoms bonded to the resin structure to constitute an $R^1 SiO_{3/2}$ unit, and it is particularly preferable to have the following partial structure (T-Dn). From an industrial perspective, $R^1$ is preferably a phenyl group, and R is preferably a methyl group or a phenyl group.

Partial Structure (T-Dn)

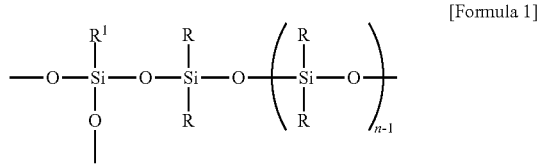
[Formula 1]

Preferably, in the above partial structure, the end of the left Si—O-bond constituting a T unit is bonded to a hydrogen atom or another siloxane unit constituting the resin structure, respectively, and is preferably bonded to another T unit. On the other hand, the end of the right Si—O-bond is bonded to another siloxane unit, triorganosiloxy unit (M unit), or a hydrogen atom that forms a linear structure or a resin structure. It is needless to say that a silanol group (Si—OH) is formed when a hydrogen atom is bonded to the end of the Si—O-bond.

In addition to the structures described above, component (A) includes an organosiloxy unit having at least one hydrosilylation-reactive group. As described above, the organosiloxy unit may be one or more types of organosiloxy units selected from triorganosiloxy units ($M^{RB}$ units), diorganosiloxy units ($D^{RB}$ units), and monoorganosiloxy units ($T^{RB}$ units), and may be bonded any moiety in the molecule as an organosiloxy unit represented by the following general formula.

$R^B_m SiO_{(4-m)/2}$      General formula:

In the formula, each $R^B$ is independently a monovalent organic group, and m is a number in the range of from 1 to 3. However, at least one of the m $R^B$ moieties in the organosiloxy unit is a hydrosilylation-reactive group. Here, suitable hydrosilylation-reactive groups are the same as those described above, and examples thereof include alkenyl groups having from 2 to 10 carbon atoms such as vinyl groups. Further, the remaining monovalent groups $R^B$ may be alkyl groups having from 1 to 20 carbon atoms or aryl groups having from 6 to 14 carbon atoms which may be substituted with halogen atoms, and methyl groups or phenyl groups are preferable industrially. Examples of organosiloxy units having such hydrosilylation-reactive groups include vinyldimethylsiloxy units, vinylmethylphenylsiloxy units, vinyldiphenylsiloxy units, vinylmethylsiloxy units, vinylphenylsiloxy units, and vinylsiloxy units. These can be and are preferably introduced into the molecule by reacting a hydrolyzable silane having a hydrosilylation-reactive group such as a vinyl group with a precursor of component (A) provided with a resin structure block and a linear structure block.

In addition to the structures described above, component (A) may further contain a triorganosiloxy unit ($M^R$ unit) or a monoorganosiloxy unit ($T^R$) having an optional functional group R in the molecule. Such an organosiloxy group may be bonded to any moiety in the molecule as an organosiloxy group represented by the following general formula.

$R_t SiO_{(4-t)/2}$      General formula:

In the formula, R is the same group as described above, and t is a number of 1 or 3. That is, the organosiloxy unit contains organosiloxy units represented by $R_3SiO_{1/2}$ and $RSiO_{3/2}$.

From the perspectives of the hot melt properties of component (A), the refractive index required to improve the mechanical strength and light extraction efficiency for the cured product thereof, and uniform coating properties when formed into a thin film, in particular, component (A) is preferably a hydrosilylation-reactive organopolysiloxane including an arylsiloxane unit represented by $R^A SiO_{3/2}$, a diorganosiloxane unit represented by $R_2SiO_{2/2}$, and optionally other organosiloxy units. More specifically, component (A) is preferably an organopolysiloxane represented by:

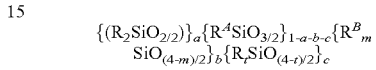

In the formula, R, RA, and RB are the same groups as described above; a is a number in the range of from 0.8 to 0.2 and more preferably a number in the range of from 0.70 to 0.25; b is a number in the range of from 0.05 to 0.001; c is a number in the range of from 0.05 to 0.00; m is a number in the range of from 1 to 3; and t is a number of 1 or 3. The organopolysiloxane represented by this compositional formula necessarily has a functional group RB containing a hydrosilylation-reactive group and includes a partial structure including an $R^A SiO_{3/2}$ unit corresponding to the resin structure and a partial structure including an $R_2SiO_{2/2}$ chain unit corresponding to the linear structure, and optionally contains an organosiloxy unit represented by $R_3SiO_{1/2}$ or $RSiO_{3/2}$, in the molecule.

(Hot Melt Properties of Component (A))

Component (A) preferably exhibits hot melt properties, and in particular is non-fluid at 25° C. and preferably has a melt viscosity of not greater than 200,000 Pa·s at 100° C. Non-fluid refers to not flowing in a no-load condition, for example, the state of being lower than the softening point measured by the softening point testing method in the ball and ring method of hot melt adhesives specified in "Testing methods for the softening point of hot melt adhesives" of JIS K 6863-1994. That is, in order to be non-fluid at 25° C., the softening point must be higher than 25° C. Preferably, component (B) has a melt viscosity of not greater than 200,000 Pa·s, not greater than 100,000 Pa·s, not greater than 50,000 Pa·s, not greater than 20,000 Pa·s, or in the range of from 10 to 20,000 Pa·s. Moreover, when the melt viscosity at 100° C. is within the range described above, the adhesiveness of the cured product after being hot-melted and then cooled to 25° C. is favorable. In addition, by using component (A) having a melt viscosity of from 100 to 150,000 Pa·s, it may be possible to suppress the deformation or peeling of the cured product after molding.

(Component (B))

Component (B) is an organopolysiloxane resin containing a curing-reactive group having a carbon-carbon double bond in the molecules. Designing component (B) so that the absolute value (ΔRI) of the difference between the refractive indices of component (A) and component (B) measured at room temperature is less than 0.05, preferably less than 0.04, and more preferably less than 0.02 has the advantages of improving the compatibility of both components, suppressing the reduction of handleability due to gelling or the generation of precipitates (crystals) derived from the resin, improving the mechanical properties—hardness, in particular—of the cured product, and not impairing the refractive index or transparency. Note that when designing this composition, component (A) and component (B) may be used alone or may each be a mixture of two or more types of components with different refractive indices. In this case, the refractive index of the entire resin-linear block copolymer type organopolysiloxane alone or a mixture thereof serving as component (A) and the refractive index of the organopolysiloxane resin having a curing-reactive group alone or a mixture thereof serving as component (B) should be such that the absolute value of the difference between the refractive indices of the two components satisfies the relationship described above, and such a form is expected of the present invention.

Component (B) must contain a curing-reactive group having a carbon-carbon double bond in the molecule, and such a curing-reactive group is a hydrosilylation-reactive functional group which forms a cured product exhibiting excellent transparency and mechanical strength/flexibility by a crosslinking reaction with component (C) or component (A) (however, only when component (A) contains silicon-bonded hydrogen atoms). In addition, since component (B) is reactive, compatibility with component (A) is improved, and a reduction in handleability due to gelling or the generation of precipitates (crystals) derived from the resin is suppressed. Such a curing-reactive group is an alkenyl group or an acrylic group, and examples thereof include alkenyl groups having from 2 to 10 carbon atoms such as vinyl groups, allyl groups, butenyl groups, pentenyl groups, hexenyl groups, and heptenyl groups; and acrylic group-containing monovalent organic groups such as 3-methacryloxypropyl groups and 3-acryloxypropyl groups. Vinyl groups or hexenyl groups are particularly preferable. On the other hand, when an organopolysiloxane resin that does not have a curing-reactive group is used, in addition to the deterioration of compatibility with component (A), the organopolysiloxane resin may be desorbed from within the composition when molded into a sheet shape or due to thermal aging during heat-curing, and a uniform sheet or cured product may not be obtained.

Component (B) must be such that the absolute value (ΔRI) of the difference between refractive indices of component (A) and component (B) measured at room temperature is less than 0.05. A known method can be used as the means for measuring the refractive index without any particular limitation, however, the refractive index at room temperature must be used as a reference, and the difference between the values of the refractive indices of the two components is preferably less than 0.02. The fact that the difference between the refractive indices of the two components is small means that the functional groups of component (A) and component (B) are similar, which improves the affinity of the two components and the transparency of the cured product. Conversely, when the difference between the refractive indices of the two components exceeds 0.05, the functional groups differ, and therefore the affinity and compatibility are diminished, and the transparency of the cured product is diminished as a result.

Specifically, component (B) is an organopolysiloxane resin having a resinous or reticulated molecular structure including any combination of triorganosiloxy units (M units), diorganosiloxy units (D units), monoorganosiloxy units (T units), and siloxy units (Q units). Examples thereof may be an organopolysiloxane resin including an $R_2SiO_{2/2}$ unit (D unit) and an $RSiO_{3/2}$ unit (T unit) (where each R moiety is independently a monovalent organic group or a hydroxyl group), an organopolysiloxane resin including a T unit alone, and an organopolysiloxane resin including an $R_3SiO_{1/2}$ unit (M unit) and a $SiO_{4/2}$ unit (Q unit) and having the curing-reactive group described above in the molecule.

In particular, an organopolysiloxane resin including an $R_3SiO_{1/2}$ unit (M unit) and a $SiO_{4/2}$ unit (Q unit) is preferably used. Note that when a hydroxyl group is present in component (B), the hydroxyl group is directly bonded to the silicon of the T units, Q units, or the like in the molecule, and is a group derived from silane as a raw material or generated as a result of the hydrolysis of silane. In addition, R in each siloxy unit described above is a monovalent organic group or a hydroxyl group and has at least one curing-reactive group in the organopolysiloxane resin molecule. From an industrial perspective, R is an alkyl group, an aryl group, an alkenyl group, or an acrylic group-containing organic group, and is particularly preferably a methyl group, a phenyl group, a vinyl group, or a hexenyl group. Note that from 30 to 95 mol % of all R moieties in the organopolysiloxane resin may be non-reactive alkyl groups or aryl groups, and may be methyl groups or phenyl groups. In addition, the content of the curing-reactive group having a carbon-carbon double bond in component (B) can be selected appropriately, however, from 5 to 70 mol % of the silicon-boned functional groups in the organopolysiloxane resin may be alkenyl groups such as vinyl groups or acrylic group-containing monovalent organic groups such as 3-acryloxypropyl groups.

Component (B) is particularly preferably an organopolysiloxane resin including a triorganosiloxy unit (M unit) selected from $(CH_3)_3SiO_{1/2}$ units, $(CH_2=CH)(CH_3)_2SiO_{1/2}$ units, $(C_6H_5)_3SiO_{1/2}$ units, $(CH_2=CH)(C_6H_5)(CH_3)SiO_{1/2}$ units, and $(CH_2=CH)(C_6H_5)_2SiO_{1/2}$ units, and a $SiO_{4/2}$ unit (Q unit), and necessarily has a $(CH_2=CH)(CH_3)_2SiO_{1/2}$ unit, a $(CH_2=CH)(C_6H_5)(CH_3)SiO_{1/2}$ unit, or a $(CH_2=CH)(C_6H_5)_2SiO_{1/2}$ unit in the molecule. Here, an organopolysiloxane resin containing a large amount of methyl groups as silicon-bonded functional groups tends to decrease in refractive index, whereas an organopolysiloxane resin containing a large amount of phenyl groups tends to increase in refractive index. Therefore, by selecting an organopolysiloxane resin containing a large amount of phenyl groups when the refractive index of component (A) measured at room temperature is high and conversely selecting an organopolysiloxane resin containing a large amount of methyl groups when the refractive index of component (A) is low, it is possible to design the composition so that the difference between the refractive indices of the two components is less than 0.05 or less than 0.02. In addition, since the types of substituents of component (A) and the substituents of component (B) match, the affinity of the two components may be improved, and the mechanical strength and transparency of a cured product formed by a curing reaction of component (B) or the like may be further improved.

The compounded amount of component (B) is in the range of from 1 to 200 parts by mass, preferably in the range of from 30 to 180 parts by mass, and more preferably in the range of from 40 to 150 parts by mass per 100 parts by mass of component (A). When the compounded amount of component (B) is less than the lower limit described above, sufficient mechanical strength cannot be achieved for the cured product. In addition, when the compounded amount of component (B) exceeds the upper limit described above, the properties derived from the resin become too strong, and the flexibility of the cured product is lost, which may diminish conformance to the substrate and cause cracking or the like in the cured product when used as a resin sheet.

(Component (C))

Component (C) is a crosslinking agent of component (B) or component (A) (however, only when component (A) contains a curing-reactive group having a carbon-carbon double bond in the molecule), and is an organohydrogenpolysiloxane, particularly an organohydrogenpolysiloxane having at least two silicon-bonded hydrogen atoms in the molecule. The molecular structure of the organohydrogenpolysiloxane is not particularly limited, however, one type or two or more types of organohydrogenpolysiloxanes selected from linear, branched, resinous, or cyclic organohydrogenpolysiloxanes having a siloxane polymerization degree of not greater than 1000 can be used without limitation, and the structure may include a resinous organohydrogenpolysiloxane resin. Note that in the present invention, component (A) and component (B) preferably both contain curing-reactive groups having carbon-carbon double bonds in the molecules such as vinyl groups, and component (C) is preferably a crosslinking agent of these components.

Specifically, examples of component (C) include dimethylpolysiloxanes capped at both molecular terminals with dimethylhydrogensiloxy groups, methylphenylpolysiloxanes capped at both molecular terminals with dimethylhydrogensiloxy groups, dimethylsiloxane/methylphenylsiloxane copolymers capped at both molecular terminals with dimethylhydrogensiloxy groups, diphenylpolysiloxanes capped at both molecular terminals with dimethylhydrogensiloxy groups, methylhydrogenpolysiloxanes capped at both molecular terminals with trimethylsilyoxy groups, methylhydrogensiloxane/dimethylsiloxane copolymers capped at both molecular terminals with trimethylsiloxy groups, methylhydrogensiloxane/dimethylsiloxane copolymers capped at both molecular terminals with dimethylhydrogensiloxy groups, and mixtures of two or more types of these organopolysiloxanes. In the present invention, component (B) is exemplified by methylhydrogensiloxane/dimethylsiloxane copolymer capped at both molecular chain terminals with trimethylsiloxy groups, which has a viscosity of 1 to 500 mPa·s at 25° C. Note that component (C) may contain, and preferably contains, a resinous organohydrogenpolysiloxane resin having the T unit or Q unit described above and having an SiH group on a silicon atom (MT resin, MQ resin), such as a dimethylhydrogensiloxane phenylsilsesquioxane copolymer, for example.

The compounded amount of component (C) is an amount necessary to cure the entire composition by a crosslinking reaction with alkenyl groups in the composition. Specifically, the compounded amount is an amount within a range such that the amount of silicon-bonded hydrogen atoms in component (C) is not less than 0.2 and more preferably in the range of from 0.5 to 2.0 mol per 1 mol of carbon-carbon double bonds participating in the hydrosilylation reaction of the composition—more specifically, alkenyl groups or the like. Note that when component (C) is compounded in excess, this may cause the generation of hydrogen gas derived from unreacted silicon-bonded hydrogen atoms, which is not preferable. However, in order to improve the adhesion of the cured product to a substrate such as glass, the use of an excessive amount of component (C) may be selected. Even if component (A) has a silicon-bonded hydrogen atom, it is preferable to add component (C), particularly a resinous organohydrogenpolysiloxane resin (MT resin, MQ resin) having a SiH group on a silicon atom.

(Component (D))

Component (D) is a curing agent of the present composition, and a known hydrosilylation reaction catalyst can be used without any particular limitation. Note that in the present invention, other curing agents such as condensation reaction catalysts, photoradical initiators, peroxides, or other radical initiators, for example, may be used in combination with the hydrosilylation reaction catalyst.

Examples of hydrosilylation reaction catalysts include platinum-based catalysts, rhodium-based catalysts, and palladium-based catalysts, and platinum-based catalysts are preferable in that they markedly accelerate the curing of the present composition. Examples of the platinum-based catalyst include platinum fine powder, chloroplatinic acid, an alcohol solution of chloroplatinic acid, a platinum-alkenyl siloxane complex, a platinum-olefin complex, a platinum-carbonyl complex, and a catalyst in which these platinum-based catalysts are dispersed or encapsulated with a thermoplastic resin such as silicone resin, polycarbonate resin, acrylic resin or the like, with a platinum-alkenyl siloxane complex particularly preferable. Examples of this alkenyl siloxane include: 1,3-divinyl-1,1,3,3-tetramethyldisiloxane; 1,3,5,7-tetramethyl-1,3,5,7-tetravinylcyclotetrasiloxane; an alkenyl siloxane obtained by substituting part of methyl groups of these alkenyl siloxanes with an ethyl group, a phenyl group, etc.; and an alkenyl siloxane obtained by substituting part of vinyl groups of these alkenyl siloxanes with an allyl group, a hexenyl group, etc. In particular, 1,3-divinyl-1,1,3,3-tetramethyldisiloxane is preferable because the platinum-alkenyl siloxane complex has good stability. As the catalyst for promoting the hydrosilylation reaction, a non-platinum based metal catalyst such as iron, ruthenium, iron/cobalt, or the like may be used.

In addition, a fine particulate platinum-containing hydrosilylation reaction catalyst dispersed or encapsulated with a thermoplastic resin may be used in the curable silicone composition of the present invention. The use of such an encapsulated curing agent provides the advantages of improved storage stability of the curing reactive silicone gel layer and control over the temperature of the curing reaction, in addition to the advantages of improved conventional handling workability and improved pot life of the composition.

In the present invention, besides heating, a hydrosilylation reaction catalyst such as a photoactive platinum complex curing catalyst that promotes a hydrosilylation reaction by high energy ray irradiation such as ultraviolet rays may be used. Such a hydrosilylation reaction catalyst is preferably exemplified by a platinum complex having a β-diketone platinum complex or a cyclic diene compound as its ligand, and platinum complexes selected from the group consisting of trimethyl(acetylacetonato)platinum complex, trimethyl(2,4-pentanedionate)platinum complex, trimethyl(3,5-heptanedionate)platinum complex, trimethyl(methylacetoacetate)platinum complex, bis(2,4-pentanedionato)platinum complex, bis(2,4-hexanedionato)platinum complex, bis(2,4-heptanedionato)platinum complex, bis(3,5-heptanedionato)platinum complex, bis(1-phenyl-1,3-butanedionato)platinum complex, bis(1,3-diphenyl-1,3-propanedionato)platinum complex, (1,5-cyclooctadienyl)dimethyl platinum complex, (1,5-cyclooctadienyl)diphenyl platinum complex, (1,5-cyclooctadienyl)dipropyl platinum complex, (2,5-norboradiene)dimethyl platinum complex, (2,5-norboradiene)diphenyl platinum complex, (cyclopentadienyl)dimethyl platinum complex, (methylcyclopentadienyl)diethyl platinum complex, (trimethylsilylcyclopentadienyl)diphenyl platinum complex, (methylcycloocta-1,5-dienyl)diethyl platinum complex, (cyclopentadienyl)trimethyl platinum complex, (cyclopentadienyl)ethyldimethyl platinum complex, (cyclopentadienyl)acetyldimethyl platinum complex, (methylcyclopentadienyl)trimethyl platinum complex, (methylcyclopentadienyl)trihexyl platinum complex, (trimethylsilylcyclopentadienyl)trimethyl platinum complex, (trimethylsilylcyclopentadienyl)trihexyl platinum complex, (dimetylphenylsilylcyclopentadienyl)triphenyl platinum complex, and (cyclopentadienyl)dimethyltrimethylsilylmethyl platinum complex are specifically exemplified.

When a curing agent which promotes a hydrosilylation reaction by the high-energy ray irradiation described above is used, it is possible to form a cured product using the curable silicone composition as a raw material without performing a heating operation.

The compounded amount of component (D) is a catalytic amount. Specifically, when the entire amount of the cured product obtained using the curable silicone composition of the present invention is 100 parts by mass, the amount is preferably such that the amount of metal atoms is within the range of from 0.01 to 500 ppm, within the range of from 0.01 to 100 ppm, or within the range of from 0.01 to 50 ppm in terms of mass units.

(Component (E))

The composition of the present invention preferably contains at least one type of (E) a phosphor or a reflective material. A composition or cured product thereof formed as a result of the dispersion of these components in a binder resin containing components (A) to (D) described above has the advantages of excellent wavelength conversion characteristics, reflectance, light extraction efficiency, and sealing performance when used as a member of a light-emitting device such as an LED.

There is no particular limitation to the phosphors that can be used in the present invention as long as the phosphor functions as a wavelength conversion material, however, examples thereof include yellow, red, green, and blue light-emitting phosphors consisting of oxide phosphors, oxynitride phosphors, nitride phosphors, sulfide phosphors, fluoride phosphors, oxysulfide phosphors, and the like, which are widely used in light-emitting diodes (LEDs) or organic light-emitting diodes (OLEDs). Examples of the oxide phosphors include yttrium, aluminum, and garnet-type YAG green to yellow light phosphors containing cerium ions; terbium, aluminum, and garnet-type TAG yellow light phosphors containing cerium ions; and silicate green to yellow light phosphors containing cerium or europium ions. In addition, exemplary oxynitride phosphors include silicon, aluminum, oxygen, and nitrogen type SiAlON red to green light phosphors containing europium ions. Exemplary nitride phosphors include calcium, strontium, aluminum, silicon, and nitrogen type CASN red light phosphors containing europium ions. Exemplary sulfide phosphors include ZnS green light phosphors containing copper ions or aluminum ions.

Exemplary fluoride phosphors include KSF phosphors ($K_2SiF_6$:$Mn^{4+}$). Exemplary oxysulfide phosphors include $Y_2O_2S$ red light phosphors containing europium ions. One phosphor may be used alone, or two or more types thereof may be used in combination.

There is no particular limitation to the reflective materials that can be used in the present invention, however, the reflective material is preferably one type or two or more types selected from titanium oxide, barium oxide, chromium oxide, iron oxide, boron nitride, and titanium nitride. Titanium oxide is particularly preferable.

The phosphor or the reflective material preferably has a structure dispersed in a binder resin containing at least a silicone resin. In addition, in order to improve dispersibility in the silicone resin, at least a portion of the phosphor or the reflective material may be surface-treated with an organosilicon compound. Specifically, at least a portion of the phosphor or the reflective material may be surface-treated by an alkoxysilane, an organohalosilane, an organosilazane, a siloxane oligomer, or the like.

The compounded amount of the phosphor or the reflective material serving as component (E) is not particularly limited, however, when the composition of the present invention is used as a resin sheet for an optical member, the component is preferably contained within the range of from 0 to 90 mass % or from 10 to 90 mass % and is particularly preferably contained within the range of from 15 to 85 mass % with respect to the total weight of the sheet.

(Reinforcing Filler)

The composition of the present invention may further contain a reinforcing filler as desired. The reinforcing filler can improve the mechanical strength of the cured product obtained by the present invention and can maintain high form retention and moderate hardness. Examples of such reinforcing fillers include inorganic fillers such as fumed silica fine powder, precipitated silica fine powder, calcined silica fine powder, fumed titanium dioxide fine powder, quartz fine powder, calcium carbonate fine powder, diatomaceous earth fine powder, aluminum oxide fine powder, aluminum hydroxide fine powder, zinc oxide fine powder, zinc carbonate fine powder. The reinforcing fillers may contain inorganic fillers obtained by surface treating these inorganic fillers with a treating agent such as organoalkoxysilanes such as methyltrimethoxysilane, organohalosilanes such as trimethylchlorosilane, organosilanes such as hexamethyldisilazane, siloxane oligomers such as $\alpha,\omega$-silanol group-capped dimethylsiloxane oligomer, $\alpha,\omega$-silanol group-capped methylphenylsiloxane oligomer, and $\alpha,\omega$-silanol group-capped methylvinylsiloxane oligomer, and the like. When the total amount of the cured product is 100 parts by mass, the compounded amount is within the range of from 0.0 to 150.0 parts by mass or within the range of from 0.0 to 120.0 parts by mass and is preferably within the range of from 1.0 to 115.0 parts by mass. Note that the shape of the particles of the silica fine powder is not particularly limited, and both solid silica and hollow silica can be used, however, in particular when hollow silica is used, high light diffusibility can be achieved due to the difference in refractive index.

(Other Components: Curing Retarders or the Like)

To the extent that the technical effect of the present invention is not impaired, the curable silicone composition may include components other than those described above. For example, the composition may include: a known curing retardant for a hydrosilylation reaction; an adhesion enhancing agent/adhesion imparting agent such as an organic functional alkoxysilane compound; a non-reactive organopolysiloxane such as polydimethylsiloxane or polydimethyldiphenylsiloxane; an antioxidant such as a phenol type, a quinone type, an amine type, a phosphorus type, a phosphite type, a sulfur type, or a thioether type; a light stabilizer such as a triazole type or a benzophenone type; a flame retardant such as a phosphate ester type, a halogen type, a phosphorus type, or an antimony type; one or more types of antistatic agents consisting of a cationic surfactant, an anionic surfactant, or a non-ionic surfactant, and the like; a dye; a pigment; a thermoconductive filler; a dielectric filler; an electrically conductive filer; a releasable component; a radical scavenger; or the like.

In addition, the curable silicone composition described above is preferably molded into a sheet shape and may be applied after being dispersed in an organic solvent for the purpose of forming a film or a thin film described below. While not particularly limited thereto, as long as the type of organic solvent used herein is a compound which may dissolve all components in the composition or a portion of the components, a type having a boiling point of 80° C. or more and of 200° C. or less is preferably used. Examples include non-halogen solvents such as i-propyl alcohols, t-butyl alcohols, cyclohexanols, cyclohexanones, methyl ethyl ketones, methyl isobutyl ketones, toluenes, xylenes, mesitylenes, 1,4-dioxanes, dibutyl ethers, anisoles, 4-methyl anisoles, ethyl benzenes, ethoxy benzenes, ethylene glycols, ethylene glycol dimethyl ethers, ethylene glycol diethyl ethers, 2-methoxy ethanols (ethylene glycol monomethyl ethers), diethylene glycol dimethyl ethers, diethylene glycol monomethyl ethers, dipropylene glycol methyl ether acetates, ethyl acetates, butyl acetates, propyl propionates (=propyl propionate), 1-methoxy-2-propyl acetates, 1-ethoxy-2-propyl acetates, octamethyl cyclotetrasiloxanes, and hexamethyl disiloxanes, and halogen solvents such as trifluoromethyl benzenes, 1,2-bis (trifluoromethyl)benzenes, 1,3-bis(trifluoromethyl)benzenes, 1,4-bis(trifluoromethyl) benzenes, trifluoromethyl chlorobenzenes, trifluoromethyl fluorobenzenes, and hydrofluoroethers. These organic solvents may be used alone, or two or more types thereof may be used as a mixture.

(Solid Composition)

As described above, the curable silicone composition may be used after being dispersed in an organic solvent for the purpose of molding into a sheet shape or the like, but it is preferably in the form of a solid composition—specifically, a solid sheet or the like—substantially free of an organic solvent after molding. Since the solid composition is a solid such as a sheet, the solid composition has excellent handleability and preferably has hot melt properties and heat curability, and therefore the composition is melted on a desired substrate and formed into a cured product by further heating. Note that the solvent can be removed by a means such as drying after molding into a sheet shape.

(Resin Sheet and Laminate for Optical Member)

The curable silicone composition of the present invention can be suitably used as a material for an optical member. In particular, when molded into a sheet shape, the composition can be disposed or laminated as a resin sheet for an optical member on a light-emitting device or a solid layer constituting a laminate used in a light-emitting device—specifically, as a sealing layer or the like on a light source or the like of a light-emitting device.

Such a resin sheet for an optical member can be designed as desired, however, the sheet is substantially flat, such that an average thickness in the center of the sheet is preferably within the range of from 10 to 1000 μm, more preferably within the range of from 20 to 950 μm, and particularly preferably within the range of from 30 to 900 μm in the width direction of the sheet. When the average thickness in the center of the sheet is less than the lower limit described above, the film thickness is too low, which may limit applications as a resin sheet for an optical member, whereas when the average thickness exceeds the upper limit described above, the thickness is too large to handle as a single layer, which may not be suitable for applications such as light-emitting devices requiring a thin profile. Note that the resin sheet for an optical member according to the present invention may have a flat and uniform structure in which the difference between the thickness at the ends of the sheet and the thickness in the center of the sheet is within 5.0% of the total film thickness of the sheet in the width direction of the sheet, with substantially no unevenness on the surface, including raised portions at both ends, and such a resin sheet for an optical member can be produced with the method proposed by the applicants in Japanese Patent Application 2017-146350.

The resin sheet for an optical member according to the present invention may have a desired area, and the sheet area is preferably not less than 225 m². In addition, the width and length of the resin sheet for an optical member according to the present invention are each preferably not less than 15 mm and particularly preferably not less than 30 mm. Further, the resin sheet for an optical member according to the present invention is a flat film with substantially no unevenness and may have a structure in which a curable composition serving as a raw material is applied uniformly and cured even on a release layer, so it can be used without any restriction in the length direction, even with a length enabling rolling onto a roll. Moreover, the resin sheet for an optical member can be used after being cut to a desired size and shape. In addition, since the cured product according to the present invention has low surface tack, the cut surface is less likely to adhere to a blade, even for fine cuts such as dicing, which yields the advantage of excellent handleability and production efficiency of the chip and sheet.

The hardness of the resin sheet for an optical member according to the present invention is dependent on the substrate and is therefore not particularly limited, but from a practical standpoint, the hardness is preferably not less than 2B in terms of the pencil hardness.

(Releasable Laminate)

In one embodiment, the resin sheet for an optical member according to the present invention can be used as a member of a laminate including a release layer. When the resin sheet for an optical member according to the present invention is formed on a release layer, the resin sheet for an optical member of the present invention or a laminate member provided with the resin sheet can be used after being peeled from the release layer. Examples of the laminate of the present invention include laminates having the following configurations. Note that in the following illustrative examples, "/" means that the respective layers face one another in the lamination direction of the laminate (typically the thickness direction orthogonal to the substrate). In addition, the substrate and the release layer may be an integral unit or the same layer (a substrate provided with material or physical irregularities so as to be releasable), and each layer may be formed from a plurality of layers.

Example 1: Substrate/release layer/resin sheet for an optical member of the present invention/other optional layer Example 2: Substrate/release layer/resin sheet for an optical member of the present invention/other optional layer/release layer/substrate In particular, as in Example 2, in a configuration in which the resin sheet for an optical member of the present invention or an optical member provided with the resin sheet is sandwiched by two release layers, a member provided with the resin sheet for an optical member of the present invention can be transported while being protected by the substrate, and the substrates provided with the release layers can be separated from both sides of the laminate so that only the resin sheet for an optical member of the present invention or an optical member is disposed or laminated on a desired structure such as a light source of a light-emitting device, for example. This is therefore useful in that the handleability can be improved.

The substrate used for the laminate is not particularly limited, however, examples thereof include paperboard, cardboard paper, clay-coated paper, polyolefin laminate paper (polyethylene laminate paper, in particular), synthetic resin films, natural fiber cloth, synthetic fiber cloth, artificial leather cloth, and metal foil. In particular, synthetic resin films are preferable, and examples of synthetic resins include polyimides, polyethylenes, polypropylenes, polystyrenes, polyvinyl chlorides, polyvinylidene chlorides, polycarbonates, polyethylene terephthalates, cyclopolyolefins, and nylons. The substrate is preferably a film-like or a sheet-like substrate. A thickness thereof is not particularly limited and can be designed with a desired thickness in accordance with the application. Note that, as described below, the substrate itself may be a material that functions as a release layer, or may have a structure provided with peelability by forming physically fine irregularities on the surface of the substrate.

The release layer may also be referred to as a release liner, a release layer, or a release coating layer, and may preferably be a release layer having a release coating ability such as a silicone-based release agent, a fluorine-based release agent, an alkyd-based release agent, or a fluorosilicone-based release agent, or it may be formed as a substrate itself which is not prone to adhering to the resin sheet for an optical member of the present invention by forming physically fine irregularities in the surface of the substrate.

The other layers in the laminate may be one or more layers and may be multiple layers with two or more different functions. In addition, the overall thickness of the laminate member laminated on the resin sheet for an optical member of the present invention is not particularly limited, however, the thickness is preferably not less than 10 µm, and from the perspective of handleability, the thickness is preferably from 50 to 10,000 µm and particularly preferably from 100 to 5,000 µm.

The resin sheet for an optical member of the present invention and a laminate provided with the resin sheet can be used as a sealing sheet, and may have a structure in which it is disposed and sealed on the light source of a light-emitting device such as an organic light-emitting diode. Here, light emitted from the light source is wavelength-converted when the resin sheet for an optical member of the present invention contains a phosphor.

In one embodiment, the resin sheet for an optical member of the present invention is produced by applying a curable silicone composition serving as a raw material of the resin sheet for an optical member to a substrate with a sheet coating production machine under conditions with a viscosity of from 10 to 10,000 mP·s at 25° C. and a film thickness of from 10 to 1000 µm in a wet state.

The substrate used in the production method for a resin sheet for an optical member according to the present invention is preferably a flexible substrate. Specifically, the substrates listed as substrates that may be used in the laminate described above may be used.

A known coating method can be used without any particular limitation as a method for coating flexible substrate with the coating solution, however, a method using an applicator or a slit coater is suitable as the production method for a resin sheet for an optical member according to the present invention in that the sheet surface is uniform and batch processing with small lots can be achieved relatively easily.

(Solid Silicone Material Layer)

The resin sheet for an optical member including the curable silicone composition of the present invention may be provided with a structure in which a solid silicone material having optical functions or optical properties differing from those of the sheet is further disposed on the sheet. Specifically, a thin film made of a solid silicone material having a different refractive index or light transmittance may be disposed in a sheet shape formed from the curable silicone composition of the present invention. For example, as proposed in Japanese Patent Application 2017-102355, a thin film formed from a solid silicone material, which has a structure containing air on the interior or in pores thereof and is formed by dispersing a certain amount of hollow or porous inorganic fine particles with a small particle size (nanometer scale) in a polymer matrix made of the resin-linear block copolymer type organopolysiloxane serving as component (A) described above, achieves a low refractive index, and when the structure has a light source and a phosphor layer serving as the resin sheet for an optical member formed from the curable silicone composition of the present invention, the light extraction efficiency from the optical device may be improved. The film thickness of such a film-like or thin film-like solid silicone material can be designed as desired.

The resin sheet for an optical member of the present invention further including a thin film formed from such a solid silicone material layer can be easily obtained by (i) forming a film by means of molding or (ii) forming a film by thin film coating and solvent removal using a solvent on a sheet formed from the curable silicone composition of the present invention described above. Note that, as described below, by using a laminate in which a film-like or thin film-like member of the solid silicone material according to the present invention is formed on a release coating layer, the film-like or thin film-like member or a laminate member containing the same can be separated from the release layer and disposed on another substrate.

The resin sheet for an optical member provided with a film-like or thin film-like member formed from the solid silicone material described above on a sheet formed from the curable silicone composition of the present invention is required to be handled alone as desired. When the solid layer formed from the solid silicone material described above is disposed on the release layer, the film-like or thin film-like member formed from the solid silicone material of the present invention and a laminate member containing the same can be easily separated from the release layer constituting the laminate and handled. Such a laminate may have a release layer facing the solid layer formed from the solid silicone material described above, and may be optionally provided with another release layer. Examples thereof include the following laminate configurations. Note that in the following examples, "/" means that the respective layers face one another in the lamination direction of the laminate (typically the thickness direction orthogonal to the substrate). In addition, the substrate and the release layer may be an integral unit or the same layer (a substrate provided with material or physical irregularities so as to be releasable).

Example 1: Substrate/release layer/solid layer formed from the solid silicone material described above/sheet formed from the curable silicone composition of the present invention (one layer or two or more layers)

Example 2: Substrate/release layer/solid layer formed from the solid silicone of the present invention/sheet formed from the curable silicone composition of the present invention (one layer or two or more layers)/release layer/substrate Note that the benefits and ways to use such a releasable laminate are as described above. In particular, the solid layer (thin film layer) formed from the solid silicone material described above is preferably disposed at the interface with air in an optical device or the like.

(Laminate Provided with Light Source, Optical Member, and Light-Emitting Device)

The resin sheet for an optical member and a cured product layer thereof according to the present invention can be disposed on a light source, preferably at the interface with air. When disposed on the light source of a light-emitting diode (LED) or an organic light-emitting diode (OLED), the resin sheet for an optical member of the present invention functions as a wavelength conversion material and a protective layer for the light source, and is preferably disposed so that light emitted from the light source is wavelength-converted by a phosphor layer and reaches the solid layer formed from the solid silicone material described above disposed at the interface with air. That is, the curable silicone resin or a cured product thereof according to the present invention is useful as an optical member used in a light-emitting device, and may be a desired optical member such as a sealing layer, a protective layer, a lens layer, a wavelength conversion layer, or a reflective layer.

The laminate provided with the light source is a light-emitting device such as a light-emitting diode (LED) or an organic light-emitting diode (OLED), and particularly preferably has a structure sealed by the resin sheet for an optical member and the cured product layer thereof according to the present invention.

(Production Method and Sealing Method for a Light-Emitting Device)

The resin sheet for an optical member of the present invention has excellent handleability, mechanical strength and transparency of the cured product, and preferably has hot melt properties and contains a phosphor or the like. Therefore, the sheet can be disposed on a desired wavelength, and a sealing structure can be formed on the desired light source by a known molding technique such as integral molding. Typical molding techniques include transfer molding, injection molding, and compression molding.

The conditions for curing the curable silicone composition or the resin sheet for an optical member according to the present invention are not particularly limited, and a curing reaction progresses at room temperature or by heating, however, the composition is preferably heated in order to quickly cure the composition. The heating temperature for this is preferably within the range of 50 to 200° C. The cured product of the curable silicone composition and the resin sheet for an optical member according to the present invention is suitable for a sealing agent or the like of an optical device.

EXAMPLES

Hereinafter, the present invention will be described by way of examples; however, the present invention is not limited thereto. Note that hereinafter, in the descriptions and tables of the examples, an organopolysiloxane having a resin-linear polymer structure obtained by Synthesis Examples 1 to 3 (component (A) in the present invention) is abbreviated as an "RL copolymer".

In addition, in the compositional formulas and structural formulas, Me is a methyl group, Ph is a phenyl group, and Vi is a vinyl group.

For Synthesis Examples 1 to 5

Organopolysiloxane resins having a resin-linear polymer structure used in the examples and the like (Synthesis Examples 1 to 3; RL copolymer) and organopolysiloxane resins containing a vinyl group (Synthesis Examples 4 and 5) were prepared using the following method. Here, Synthesis Examples 1 and 2 are synthesis examples of high refractive index type RL copolymers, and Synthesis Example 3 is a synthesis example of an RL copolymer with an ordinary refractive index. In addition, Synthesis Examples 4 and 5 are synthesis examples of vinyl group-containing organopolysiloxane resins having different refractive indices.

Synthesis Example 1

A 1 L four-neck round-bottom flask was filled with a phenylsilsesquioxane hydrolysate (247.50 g, 1.81 mol of Si) and propyl propionate (210.43 g). The mixture was heated at reflux for 30 minutes in a nitrogen atmosphere. The reaction mixture was cooled to 100° C., and then a propyl propionate solution of diacetoxy-terminated polyphenylmethylsiloxane (308.95 g, degree of siloxane polymerization: 188) was added. The reaction mixture was heated at reflux for two hours. Thereafter, methylvinyldiacetoxysilane (16.13 g, 0.09 mol of Si) was added, and the mixture was refluxed for one hour. Water (47 mL) was added, and the aqueous phase was removed by azeotropic distillation. Methyltriacetoxysilane (32 g, 0.15 mol of Si) was added, and the mixture was refluxed for one hour. Water (47 mL) was added, and the aqueous phase was removed by azeotropic distillation. This procedure was repeated two more times to reduce the acetic acid concentration, and some of the propyl propionate was further distilled off to obtain a propyl propionate solution of an organopolysiloxane having a transparent resin-linear polymer structure (weight average molecular weight=96,000, solid content concentration: 78.70%).

Synthesis Example 2

A 1 L four-neck round-bottom flask was filled with a phenylsilsesquioxane hydrolysate (302.50 g, 2.214 mol of Si) and propyl propionate (210.20 g). The mixture was heated at reflux for 30 minutes in a nitrogen atmosphere. The reaction mixture was cooled to 100° C., and then a propyl propionate solution of diacetoxy-terminated polyphenylmethylsiloxane (256.35 g, degree of siloxane polymerization: 112) was added. The reaction mixture was heated at reflux for two hours. Thereafter, methylvinyldiacetoxysilane (16.16 g, 0.09 mol of Si) was added, and the mixture was refluxed for one hour. Water (60 mL) was added, and the aqueous phase was removed by azeotropic distillation. Methyltriacetoxysilane (40 g, 0.18 mol of Si) was added, and the mixture was refluxed for one hour. Water (60 mL) was added, and the aqueous phase was removed by azeotropic distillation. Thereafter, methyltriacetoxysilane (5.07 g, 0.02 mol of Si) was further added, and the mixture was refluxed for one hour. Water (60 mL) was added, and the aqueous phase was removed by azeotropic distillation. This procedure was repeated two more times to reduce the acetic acid concentration, and some of the propyl propionate was further distilled off to obtain a propyl propionate solution of an organopolysiloxane having a transparent resin-linear polymer structure (weight average molecular weight=85,600, solid content concentration: 71.16%).

Synthesis Example 3

A 1 L four-neck round-bottom flask was filled with a phenylsilsesquioxane hydrolysate (135.00 g, 0.988 mol of Si) and toluene (360 g). The mixture was heated at reflux for 30 minutes in a nitrogen atmosphere. After the reaction mixture was cooled to 100° C., a toluene solution of diacetoxy-terminated polydimethylsiloxane (185.80 g, degree of siloxane polymerization: 50) was added. The reaction mixture was heated at reflux for two hours. Thereafter, methyltriacetoxysilane (2.63 g, 0.012 mol of Si) was added, and the mixture was refluxed for one hour. Methylvinyldiacetoxysilane (12.61 g, 0.067 mol of Si) was added, and the mixture was refluxed for two hours. Water (74 mL) was added, and the aqueous phase was removed by azeotropic distillation. Acetic acid (12.11 g) was added and heated to 90° C., and then 1,1,1,3,3,3-hexamethyldisilazane (32.48 g) was added dropwise. The mixture was refluxed for four hours. Water (74 mL) was added, subjected to azeotropic distillation for 30 minutes, and left to stand to remove the aqueous layer. This operation was performed a total of four times. The water was then replaced with saturated saline (74 mL), and the same operation was repeated twice. Further, the saturated saline was replaced with water, and the same operation was repeated twice to reduce the acetic acid concentration. Propyl propionate was added to this mixture and solvent-exchanged with toluene to obtain a propyl propionate solution of an organopolysiloxane having a transparent resin-linear polymer structure (weight average molecular weight: 73,900, solid content concentration: 72.9%).

Synthesis Example 4

Tetraethoxysilane (80 g, 0.384), diphenylmethylchlorosilane (32.18 g, 0.138 mol), methylphenylvinylmethoxysilane (2.73 g, 0.015 mol), toluene (40 g), and ethanol (40 g) were added to a 300 ml four-neck round-bottom flask, and water (20.74 g, 1.15 mol) was slowly added dropwise while stirring. The mixture was stirred at room temperature for 30 minutes, and then the mixture was heated at reflux for two hours. Water was removed by azeotropic distillation, and after it was confirmed that the reaction solution had become neutral, sodium hydroxide (0.079 g, 0.002 mol) was added. Azeotropic distillation was performed again to remove residual water, and the mixture was refluxed for four hours at 107° C. The solid content was removed by filtration, and then a resin with a refractive index of 1.540 and a weight average molecular weight of 10,600 was obtained by vacuum drying.

Synthesis Example 5

Diphenyltetramethyldisiloxane (61.0 g, 0.192 mol), divinyltetramethyldisiloxane (15.2 g, 0.082 mol), hexamethyldisiloxane (10.1 g, 0.062 mol), toluene (33 g), ethanol (33.3 g), and trifluoromethanesulfonate (1.94 g, 0.013 mol) were added to a 500 ml four-neck round-bottom flask and stirred. Tetraethoxysilane (200 g, 0.96 mol) was further added, and water (57.0 g, 3.17 mol) was slowly added dropwise while stirring. After dropping, the mixture was heated at reflux for one hour. Thereafter, the volatile content was removed until the solution temperature reached 80° C. Sodium hydroxide (0.785 g, 0.02 mol) and toluene (100 g) were added, and water was removed by azeotropic distillation and refluxed for four hours at 110° C. After the solid content was removed by filtration, a resin with a refractive index of 1.482 and a weight average molecular weight of 3,800 was obtained by vacuum drying.

Examples and Comparative Examples: Preparation of Raw Material Solutions

The solutions A to G (raw material solutions) to be used in the curable silicone compositions of the examples and comparative examples were prepared by the following method.

<Solution A Preparation>
A divinylsiloxane complex of platinum was added to the propyl propionate solution of the RL copolymer obtained in Synthesis Example 1 (solid content concentration: 78.7%, 562.15 g) in an amount of 2 ppm in terms of platinum content, and the mixture was stirred uniformly using mechanical force to obtain a solution A.

<Solution B Preparation>
An organohydrogensiloxane resin (20.26 g) represented by the compositional formula: $(HMe_2SiO_{1/2})_{0.60}(PhSiO_{3/2})_{0.4}$ was added to the propyl propionate solution of the RL copolymer obtained in Synthesis Example 1 (solid content concentration: 78.7%, 562.15 g) and stirred using mechanical force to obtain a solution B.

<Solution C Preparation>
An organohydrogensiloxane resin (42.64 g) represented by the compositional formula: $(HMe_2SiO_{1/2})_{0.60}(PhSiO_{3/2})_{0.4}$ was added to a toluene solution of a vinyl group-containing organopolysiloxane resin represented by the compositional formula: $(Me_2ViSiO_{1/2})_{0.25}(PhSiO_{3/2})_{0.75}$, and toluene was distilled off using an evaporator to obtain a solution C. The SiH/Vi ratio of the resulting solution was 0.91 from $^{29}$Si NMR.

<Solution D Preparation>
An organohydrogensiloxane resin (39.5 g) represented by the compositional formula: $(HMe_2SiO_{1/2})_{0.60}(PhSiO_{3/2})_{0.4}$ was added to a toluene solution of a vinyl group-containing organopolysiloxane resin represented by the compositional formula: $(MePhViSiO_{1/2})_{0.23}(PhSiO_{3/2})_{0.77}$, and toluene was distilled off using an evaporator to obtain a solution D. The SiH/Vi ratio of the resulting solution was 0.96 from $^{29}$Si NMR.

<Solution E Preparation>
An organohydrogensiloxane resin (21.4 g) represented by the compositional formula: $(HMe_2SiO_{1/2})_{0.60}(PhSiO_{3/2})_{0.4}$ was added to a toluene solution of a vinyl group-containing organopolysiloxane resin represented by the compositional formula: $(Me_2SiO_{2/2})_{0.10}(MeViSiO_{2/2})_{0.15}(PhSiO_{3/2})_{0.75}$, and after toluene was distilled off using an evaporator, 69.9 g of propyl propionate was added to obtain a solution E (solid content concentration: 72.3%). The SiH/Vi ratio of the resulting solution was 0.98 from $^{29}$Si NMR.

<Solution F Preparation>
A divinylsiloxane complex of platinum was added to a propyl propionate solution of the RL copolymer obtained in Synthesis Example 3 (solid content concentration: 72.9%, 48.045 g) in an amount of 2 ppm in terms of platinum content, and the mixture was stirred uniformly using mechanical force to obtain a solution F.

<Solution G Preparation>
A both-terminal SiH organohydrogentrisiloxane (2.446 g) represented by the structural formula: $HMe_2SiOPh_2SiOSiHMe_2$ and an organohydrogensiloxane resin (0.246 g) represented by the compositional formula: $(HMe_2SiO_{1/2})_{0.60}(PhSiO_{3/2})_{0.4}$ was added to the propyl propionate solution of the RL copolymer obtained in Synthesis Example 3 (solid content concentration: 72.9%, 46.350 g) and stirred using mechanical force to obtain a solution G.

Hereinafter, the average thicknesses of the sheet-like compositions in the examples and the like were measured using a film thickness meter (DIGIMICRO MFC-101A, manufactured by Nikon).

Example 1

First, 10 g of solution A, 10 g of solution B, and 1.36 of solution C described above were mixed, and after a divinyldisiloxane complex of platinum was added in an amount of 1 ppm in terms of platinum content, the mixture was stirred uniformly using mechanical force while degassing under reduced pressure to obtain an adjustment solution 1.

The obtained adjustment solution 1 was cast on a T788 PET film (release film) manufactured by Daicel Value Coating, Ltd. using a coating machine (Pi-1210 FILM COATER) with a gap of 210 μm, and then dried for 30 minutes in an oven set to 70° C. to obtain a sheet-like composition. Here, the average thickness of the obtained sheet was 80 μm.

Example 2

A sheet-like composition with a thickness of 80 μm was obtained in the same manner as in Example 1 with the exception that the amount of solution C was 3.34 g and the amount of the organohydrogensiloxane resin represented by the compositional formula: $(HMe_2SiO_{1/2})O_{0.60}(PhSiO_{3/2})_{0.4}$ was 0.07 g.

Example 3

A sheet-like composition with a thickness of 80 μm was obtained in the same manner as in Example 1 with the exception that the amount of solution C was 5.50 g and the amount of the organohydrogensiloxane resin represented by the compositional formula: $(HMe_2SiO_{1/2})_{0.60}(PhSiO_{3/2})_{0.4}$ was 0.12 g.

Example 4

A sheet-like composition with a thickness of 80 μm was obtained in the same manner as in Example 1 with the exception that 1.36 of solution D was added instead of solution C and the amount of the organohydrogensiloxane resin represented by the compositional formula: $(HMe_2SiO_{1/2})_{0.60}(PhSiO_{3/2})_{0.4}$ was 0.02 g.

Example 5

A sheet-like composition with a thickness of 80 μm was obtained in the same manner as in Example 1 with the exception that 3.40 of solution D was added instead of solution C and the amount of the organohydrogensiloxane resin represented by the compositional formula: $(HMe_2SiO_{1/2})_{0.60}(PhSiO_{3/2})_{0.4}$ was 0.03 g.

Example 6

A sheet-like composition with a thickness of 80 μm was obtained in the same manner as in Example 1 with the exception that 5.50 of solution D was added instead of solution C and the amount of the organohydrogensiloxane resin represented by the compositional formula: $(HMe_2SiO_{1/2})O_{0.60}(PhSiO_{3/2})O_{0.4}$ was 0.05 g.

Example 7

A sheet-like composition with a thickness of 80 μm was obtained in the same manner as in Example 1 with the exception that 1.60 of solution E was added instead of solution C and the amount of the organohydrogensiloxane resin represented by the compositional formula: $(HMe_2SiO_{1/2})O_{0.60}(PhSiO_{3/2})O_{0.4}$ was 0.04 g.

Example 8

A sheet-like composition with a thickness of 80 μm was obtained in the same manner as in Example 1 with the exception that 4.10 of solution E was added instead of solution C and the amount of the organohydrogensiloxane resin represented by the compositional formula: $(HMe_2SiO_{1/2})O_{0.60}(PhSiO_{3/2})O_{0.4}$ was 0.008 g.

Example 9

A sheet-like composition with a thickness of 80 μm was obtained in the same manner as in Example 1 with the exception that 7.20 of solution E was added instead of solution C and the amount of the organohydrogensiloxane resin represented by the compositional formula: $(HMe_2SiO_{1/2})_{0.60}(PhSiO_{3/2})_{0.4}$ was 0.012 g.

Example 10

A sheet-like composition with a thickness of 80 μm was obtained in the same manner as in Example 1 with the exception that 1.14 g of the resin obtained in Synthesis Example 4 (vinyl group-containing organopolysiloxane resin) was added instead of solution C and the amount of the organohydrogensiloxane resin represented by the compositional formula: $(HMe_2SiO_{1/2})O_{0.60}(PhSiO_{3/2})O_{0.4}$ was 0.027 g.

Example 11

First, 8 g of solution F and 8 g of solution G described above as well as 0.793 g of a vinyl group-containing organopolysiloxane resin represented by the compositional formula: $(Me_3SiO_{1/2})_{0.05}(Me_2ViSiO_{1/2})_{0.50}(SiO_{4/2})O_{0.45}$ were mixed, and an organohydrogensiloxane resin (0.850 g) represented by the compositional formula: $(HMe_2SiO_{1/2})_{0.60}(PhSiO_{3/2})_{0.4}$ and a divinyl disiloxane complex of platinum in an amount of 1 ppm in terms of platinum content were further added and stirred uniformly using mechanical force while degassing under reduced pressure to obtain an adjustment solution 11.

A sheet-like composition with a thickness of 80 μm was obtained for the resulting adjustment solution 11 in the same manner as for adjustment solution 1 in Example 1.

Example 12

First, 8 g of solution F and 8 g of solution G described above as well as 2.017 g of a mixture of a vinyl group-containing organopolysiloxane resin represented by the compositional formula: $(Me_3SiO_{1/2})_{0.05}(Me_2ViSiO_{1/2})_{0.17}(PhSiO_{3/2})_{0.39}(MeSiO_{3/2})_{0.39}$ and a both-terminal SiH organohydrogentrisiloxane represented by the structural formula: $HMe_2SiOPh_2SiOSiHMe_2$ with a mass ratio of 84:16 were mixed, and an organohydrogensiloxane resin (0.260 g) represented by the compositional formula: $(HMe_2SiO_{1/2})_{0.60}(PhSiO_{3/2})_{0.4}$ and a divinyl disiloxane complex of platinum in an amount of 1 ppm in terms of platinum content were further added and stirred uniformly using mechanical force to obtain an adjustment solution 12.

A sheet-like composition with a thickness of 80 μm was obtained for the resulting adjustment solution 12 in the same manner as for adjustment solution 1 in Example 1.

Comparative Example 1

A sheet-like composition with a thickness of 80 μm was obtained in the same manner as in Example 1 with the exception that solution C was not added.

Comparative Example 2

A sheet-like composition with a thickness of 80 μm was obtained in the same manner as in Example 1 with the exception that 2.70 g of the resin obtained in Synthesis Example 5 (vinyl group-containing organopolysiloxane resin) was added instead of solution C and the amount of the organohydrogensiloxane resin represented by the compositional formula: $(HMe_2SiO_{1/2})_{0.60}(PhSiO_{3/2})_{0.4}$ was 0.154 g.

Comparative Example 3

Here, 8 g of solution F and 8 g of solution G described above were uniformly stirred using mechanical force to obtain an adjustment solution C3.

A sheet-like composition with a thickness of 80 μm was obtained for the resulting adjustment solution C3 in the same manner as for adjustment solution 1 in Example 1.

Comparative Example 4

First, 8 g of solution A and 8 g of solution B described above as well as 1.26 g of a vinyl group-containing organopolysiloxane resin represented by the compositional formula: $(Me_3SiO_{1/2})O_{0.05}(Me_2ViSiO_{1/2})O_{0.50}(SiO_{4/2})O_{0.45}$ were mixed, and an organohydrogensiloxane resin (0.850 g) represented by the compositional formula: $(HMe_2SiO_{1/2})_{0.60}(PhSiO_{3/2})_{0.4}$ and a divinyl disiloxane complex of platinum in an amount of 1 ppm in terms of platinum content were further added and stirred uniformly using mechanical force while degassing under reduced pressure to obtain an adjustment solution C4.

A sheet-like composition with a thickness of 80 μm was obtained for the resulting adjustment solution C4 in the same manner as for adjustment solution 1 in Example 1.

Comparative Example 4'

An attempt was made to create a sheet-like composition with a thickness of 80 μm in the same manner as in Comparative Example 4 with the exception that an MQ-type organopolysiloxane resin not containing a curing-reactive group such as a vinyl group was added instead of the vinyl group-containing organopolysiloxane resin in Comparative Example 4.

However, this sheet-like composition exhibited desorption of the MQ-type organopolysiloxane resin in an oven, and substantial irregularities were generated on the sheet surface, so it was not possible to obtain a uniform sheet-like composition. Therefore, no subsequent measurement of hardness or the like was made.

Evaluation of Examples 1 to 12 and Comparative Examples 1 to 4

A semi-cured sheet and a cured product thereof was prepared by laminating the sheet-like composition with a thickness (film thickness) of 80 μm in the following manner, and the physical properties thereof were measured. The measurement results are shown in Tables 1 and 2.

(Method for Measuring Viscoelasticity of a Semi-Cured Sheet)

An integrated sheet (semi-cured sheet) with a thickness of 1 mm was fabricated by laminating 15 sheets with a film thickness of 80 um, pressure-bonding while heating for 3 minutes with a vacuum pump initially set to 50° C. using a mold with a thickness of 1 mm, and then further pressure-bonding while heating for 1 minute with a press set to 90° C. The sheet was cut out to a diameter of 8 mm to form a measurement sample. This sample was measured with the following measurement device and under the following measurement conditions, and the values of the minimum storage modulus (G' (kPa) and Max tan δ (delta) were measured.

Measurement device: AntonPaar MCR301 viscoelasticity measuring device
Geometry: Equilibrium disc type (8 mm)
Strain: 0.2%
Frequency: 1.0 Hz
Start temperature: 50° C.
Rate of temperature increase: 25° C./min
End-point temperature: 150° C.
End-point temperature retention time: 30 min (Measurement of Hardness of Cured Product)

Two sheets with a thickness of 1 mm obtained above were laminated and pressure-bonded while heating for 3 minutes with a vacuum press initially set to 50° C. using a mold with a thickness of 2 mm, the sheets were then pressed for 30 minutes with a press set to 150° C., removed from the mold, heated for 1 hour in an oven set to 120° C., and then heated to 160° C. for 2 hours to obtain a cured product with a thickness of 2 mm. The Shore D hardness of the resulting cured product was measured.

Note that in the tables, the Shore A hardness was also measured for samples indicated with an asterisk.

(Measurement of Light Transmittance of Cured Product)

The transmittance at a wavelength of 450 nm was measured using the cured product with a thickness of 2 mm obtained above.

In Table 1 or Table 2, the numerical quantities of each of the components in Examples 1 to 12 and Comparative Examples 1 to 4 are in units of g (mass), and the expression of each component in the table is as follows. ΔRI in the tables is an absolute value of the difference between the refractive indices of component (A) and component (B). Note that in all of the examples and comparative examples, the platinum metal content (Pt) is 1 ppm, and the SiH/Vi ratio is uniformly 1.0.

(a1) RL-HRI: Organopolysiloxane having a resin-linear polymer structure obtained in Synthesis Example 1

(a3) RL-MRI: Organopolysiloxane having a resin-linear polymer structure obtained in Synthesis Example 3

(b1) $M^{Vi}T^{Ph}$: Vinyl group-containing organopolysiloxane resin represented by the compositional formula: $(Me_2ViSiO_{1/2})O_{0.25}(PhSiO_{3/2})O_{0.75}$ (b2) $M^{PhVi}T^{Ph}$: Vinyl group-containing organopolysiloxane resin represented by the compositional formula: $(MePhViSiO_{1/2})_{0.23}(PhSiO_{3/2})_{0.77}$ (b3) $DD^{Vi}T^{Ph}$: Vinyl group-containing organopolysiloxane resin represented by the compositional formula: $Me_2SiO_{2/2})_{0.10}(MeViSiO_{2/2})_{0.15}(PhSiO_{3/2})_{0.75}$ (b4) Resin (Vi)-HRI: Vinyl group-containing organopolysiloxane resin obtained in Synthesis Example 4

(b5) Resin (Vi)-MRI: Vinyl group-containing organopolysiloxane resin obtained in Synthesis Example 5

(b6) $MM^{Vi}Q(1)$: Vinyl group-containing organopolysiloxane resin represented by the compositional formula: $(Me_3SiO_{1/2})_{0.05}(Me_2ViSiO_{1/2})_{0.50}(SiO_4/2)_{0.45}$ (b7/c1) $MM^{Vi}TT^{Ph}/SiH$: Mixture of a vinyl group-containing organopolysiloxane resin represented by the compositional formula: $(Me_3SiO_{1/2})_{0.05}(Me_2ViSiO_{1/2})_{0.17}(PhSiO_{3/2})_{0.39}(MeSiO_{3/2})_{0.39}$ and a both-terminal SiH organohydrogentrisiloxane represented by the structural formula: $HMe_2SiOPh_2SiOSiHMe_2$ with a mass ratio of 84:16

(b8) MM$^{Vi}$Q(2): Vinyl group-containing organopolysiloxane resin represented by the compositional formula: (Me$_3$SiO$_{1/2}$)O$_{0.43}$(Me$_2$ViSiO$_{1/2}$)$_{0.14}$(SiO$_{4/2}$)O$_{0.43}$ (c2) M$^H$T$^{Ph}$: Organohydrogensiloxane resin represented by the compositional formula: (HMe$_2$SiO$_{1/2}$)O$_{0.60}$(PhSiO$_{3/2}$)O$_{0.4}$ (c3) SiH: Both-terminal SiH organohydrogentrisiloxane represented by the structural formula: HMe$_2$SiOPh$_2$SiOSiHMe$_2$ optical member to be used to seal an optical device, and the performance thereof was measured using the following method. Note that in Examples 14 to 16 and Comparative Example 5, "parts" refers to "parts by weight".

<Evaluation Method>

When a resin sheet for an optical member containing a phosphor such as that of the examples below was made to conform to and sealed over an LED device including 8 LED chips with a height of 150 um in the vertical direction and

TABLE 1

| Experiment Example No. | Example | | | | | | | | | | | |
|---|---|---|---|---|---|---|---|---|---|---|---|---|
| Component (g) | 1 | 2 | 3 | 4 | 5 | 6 | 7 | 8 | 9 | 10 | 11 | 12 |
| (a1) RL-HRI | | | | | 14.8 | | | | | | | |
| (a3) RL-MRI | | | | | | | | | | | 11.0 | |
| (b1) M$^{Vi}$T$^{Ph}$ | 1.09 | 2.66 | 4.38 | | | | | | | | | |
| (b2) M$^{PhVi}$T$^{Ph}$ | | | | 1.09 | 2.72 | 4.40 | | | | | | |
| (b3) DD$^{Vi}$T$^{Ph}$ | | | | | | | 1.02 | 2.63 | 4.61 | | | |
| (b4) Resin (Vi)-HRI | | | | | | | | | | 1.14 | | |
| (b5) Resin (Vi)-MRI | | | | | | | | | | | | |
| (B6) MM$^{Vi}$Q (1) | | | | | | | | | | | 0.79 | |
| (b7/c1) MM$^{Vi}$TT$^{Ph}$/SiH | | | | | | | | | | | | 2.02 |
| (b8) MM$^{Vi}$Q (2) | | | | | | | | | | | | |
| (c2) M$^H$T$^{Ph}$ | 0.65 | 1.09 | 1.58 | 0.63 | 1.05 | 1.49 | 0.48 | 0.69 | 0.95 | 0.37 | 0.89 | 0.30 |
| (c3) SiH | | | | | | | | | | | 0.39 | 0.71 |
| Δ RI | | 0.009 | | | 0.013 | | | 0.002 | | 0.016 | | 0.038 |
| Transparency | 96 | 97 | 95 | 97 | 97 | 97 | 96 | 97 | 95 | 97 | 82 | 82 |
| Shore D Hardness | 51 | 58 | 61 | 53 | 58 | 62 | 50 | 56 | 59 | 53 | 26*1 | 25*2 |
| Min G' (kPa) at 150 C. | 2.5 | 1.0 | 0.5 | 1.6 | 0.6 | 0.2 | 3.1 | 1.3 | 0.6 | 4.8 | 0.01 | 0.02 |
| Tan delta max at 150 C. | 1.95 | 2.48 | 2.80 | 2.17 | 2.98 | 4.21 | 1.78 | 2.52 | 3.25 | 1.57 | 11.5 | 3.54 |

*Shore A Hardness
(1) 74,
(2) 72

TABLE 2

| Experiment Example No. | Comparative Example | | | |
|---|---|---|---|---|
| Component (g) | 1 | 2 | 3 | 4 |
| (a1) RL-HRI | 14.8 | | | |
| (a3) RL-MRI | | | 11.0 | |
| (b1) M$^{Vi}$T$^{Ph}$ | | | | |
| (b2) M$^{PhVi}$T$^{Ph}$ | | | | |
| (b3) DD$^{Vi}$T$^{Ph}$ | | | | |
| (b4) Resin (Vi)-HRI | | | | |
| (b5) Resin (Vi)-MRI | | 1.02 | | |
| B6) MM$^{Vi}$Q(1) | | | | |
| (b7/c1) MM$^{Vi}$TT$^{Ph}$/SiH | | | | |
| (b8) MM$^{Vi}$Q(2) | | | | 1.26 |
| (c2) M$^H$T$^{Ph}$ | 0.34 | 0.49 | 0.05 | 0.41 |
| (c3) SiH | | | 0.49 | 0.39 |
| Δ RI | — | 0.074 | — | 0.056 |
| Transparency | 94 | 7 | 91 | 74 |
| Shore D Hardness | 45 | 49 | 39.3 | 90.4 |
| Min G' (kPa) at 150 C. | 3.6 | 5.2 | 0.009 | 0.016 |
| Tan delta max at 150 C. | 1.612 | 1.321 | 15.92 | 5.704 |

* Shore A Hardness 3) 56, 4) 50

Examples 13 to 15 and Comparative Example 5: Resin Sheet for an Optical Member Containing a Phosphor Hereinafter, a phosphor was blended into the compositions and the like obtained in the examples and synthesis examples described above to prepare resin sheets for an optical member to be used to seal an optical device, and the 8 LED chips in the horizontal direction at intervals of 2.5 using a vacuum press at low to high temperatures of 120° C., 132° C., 145° C., or 160° C., the results shown in Table 3 were obtained.

Example 13

A YAG phosphor NYAG-4454S8 (average particle size: 8 μm) was added in an amount of 80 parts to the same composition as in Example 2 (solid content: 20 parts), and this was applied with a gap of 250 μm using the method according to Example 1 and dried for 30 minutes in an oven at 70° C. to obtain a resin sheet for an optical member with a thickness (film thickness) of 100 μm.

Example 14

A resin sheet for an optical member with a thickness (film thickness) of 100 μm was obtained in the same manner as in Example 14 with the exception that the same composition as in Example 5 (solid content: 20 parts) was used instead of the same composition as in Example 2.

Example 15

A resin sheet for an optical member with a thickness (film thickness) of 100 μm was obtained in the same manner as in Example 14 with the exception that the same composition as in Example 8 (solid content: 20 parts) was used instead of the same composition as in Example 2.

Comparative Example 5

A resin sheet for an optical member with a thickness (film thickness) of 100 μm was obtained in the same manner as in Example 14 with the exception that a composition (solid content: 20 parts) prepared by adding an organohydrogensiloxane resin represented by the compositional formula: $(HMe_2Si_{1/2})_{0.60}(PhSiO_{3/2})_{0.4}$ in an amount so that the SiH/Vi ratio in the composition was 1 and adding a divinylsiloxane complex of platinum in an amount of 1 ppm in terms of platinum content to the solution obtained in Synthesis Example 2 (organopolysiloxane having a high refractive index type resin-linear polymer structure) was used instead of the same composition as in Example 2.

TABLE 3

| | Example 13 | Example 14 | Example 15 | Comparative Example 5 |
|---|---|---|---|---|
| Temperature of upper and lower plates of the press | 150° C. | 150° C. | 150° C. | 170° C. |
| Temperature and lamination results of the device at the time of conformal lamination recompression | Successful conformance to device at 120° C. | Successful conformance to device at 120° C. | Failed conformance to device at 120° C. Successful conformance to device at 120° C. | Failure without sufficient shape conformance due to lack of flow at all temperatures of 120° C., 132° C., 145° C., and 160° C. |

Summary of Examples 1 to 12 and Comparative Examples 1 to 4 and 4'

By using component (B) in the form of a curing-reactive organopolysiloxane resin yielding a refractive index difference of less than 0.05 between component (A) and component (B) of the present invention, as in Examples 1 to 12, it was possible to obtain sheet-like compositions having excellent flexibility and light transmittance (transparency) and exhibiting excellent heat moldability. On the other hand, when component (B) was missing or component (B) with a large difference in refractive index relative to component (A) was used, the hardness or transmittance was insufficient, and it was not possible to obtain a uniform sheet.

Summary of Examples 13 to 15 and Comparative Example 5

For the resin sheets for optical members prepared by adding phosphors to the silicone compositions described above, heat shaping was successful in Examples 13 to 15, but in Comparative Example 5 in which component (B) was missing, the heat moldability was dramatically reduced, and sealing was unsuccessful.

The invention claimed is:
1. A curable silicone composition comprising:
(A) 100 parts by mass of an organopolysiloxane having an arylsiloxane unit represented by $R^4SiO_{3/2}$, where $R^4$ is an aryl group having from 6 to 14 carbon atoms, and a polydiorganosiloxane structure represented by $(R_2SiO_{2/2})_n$, where R is an alkyl group having from 1 to 20 carbon atoms or an aryl group having from 6 to 14 atoms which may be substituted with a halogen atom, and n is a number in the range of from 3 to 1000, in the molecule, and having an average of one or more hydrosilylation-reactive groups in the molecule;
(B) from 1 to 200 parts by mass of an organopolysiloxane resin containing a curing-reactive group having a carbon-carbon double bond in the molecule;
(C) an organohydrogenpolysiloxane having at least two silicon-bonded hydrogen atoms in the molecule, in an amount in a range in which an amount of silicon-bonded hydrogen atoms in component (C) is not less than 0.2 mol per 1 mol of carbon-carbon double bonds in the composition; and
(D) a catalytic amount of a hydrosilylation reaction catalyst;
wherein an absolute value (ARI) of a difference between refractive indices of component (A) and component (B) measured at room temperature is less than 0.05; and
wherein at least a portion of component (C) is (C1) a resinous or reticulated organohydrogenpolysiloxane resin comprising any combination of triorganosiloxy units (M units), diorganosiloxy units (D units), monoorganosiloxy units (T units), and siloxy units (Q units), and having at least two silicon-bonded hydrogen atoms in the molecule.

2. The curable silicone composition according to claim 1, wherein component (B) is (B1) a resinous or reticulated organopolysiloxane resin comprising any combination of triorganosiloxy units (M units), diorganosiloxy units (D units), monoorganosiloxy units (T units), and siloxy units (Q units), and having at least two alkenyl groups having from 2 to 10 carbon atoms in the molecule.

3. The curable silicone composition according to claim 1, wherein component (A) is an organopolysiloxane containing an arylsiloxane unit represented by $R^4SiO_{3/2}$, where $R^4$ is as described above, in an amount of from 20 to 80 mass % of the entire organopolysiloxane.

4. The curable silicone composition according to claim 1, wherein component (A) is an organopolysiloxane represented by the average compositional formula:

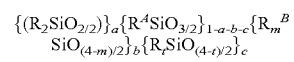

where R is an alkyl group having from 1 to 20 carbon atoms or an aryl group having from 6 to 14 atoms which may be substituted with a halogen atom; $R^4$ is an aryl group having from 6 to 14 carbon atoms; each RB moiety is independently a monovalent organic group; at least one of the m RB moieties is a hydrosilylation-reactive group; a is a number in a range of from 0.8 to 0.2; b is a number in a range of from 0.05 to 0.001; c is a number in a range of from 0.05 to 0.00; m is a number in a range of from 1 to 3; and t is a number of 1 or 3; and where the hydrosilylation-reactive group serving as a portion of RD is an alkenyl group having from 2 to 10 carbon atoms.

5. The curable silicone composition according to claim 1, wherein component (A) is an organopolysiloxane having hot melt properties.

6. The curable silicone composition according to claim 1, wherein the absolute value (ARI) of a difference between refractive indices of component (A) and component (B) measured at room temperature is less than 0.02.

7. The curable silicone composition according to claim 1, further comprising (E) a phosphor or a reflective material, optionally wherein a content of the phosphor or reflective material (E) in the composition is within a range of from 0 to 90 mass %.

8. The curable silicone composition according to claim 1, wherein the curable silicone composition is in a form of a solid composition substantially free of an organic solvent and is molded into a sheet shape.

9. The curable silicone composition according to claim 8, wherein an average thickness of the sheet is from 10 to 1000 µm.

10. The curable silicone composition according to claim 1, wherein the curable silicone composition is in a form of a liquid composition in which solid content is dispersed in a solvent.

11. A resin sheet for an optical member comprising the curable silicone composition according to claim 1.

12. A resin sheet for an optical member obtained by removing the solvent from the curable silicone composition according to claim 10.

13. The resin sheet for an optical member according to claim 11, further provided with structure in which a solid silicone material having optical functions or optical properties differing from those of the sheet is further disposed on the sheet.

14. A laminate comprising the resin sheet for an optical member according to claim 11.

15. The laminate according to claim 14, further comprising a release layer facing the resin sheet for an optical member.

16. An optical member comprising a curable silicone composition or a cured product thereof, wherein the curable silicone composition is according to claim 1.

17. A light-emitting device having a structure sealed by a curable silicone composition or a cured product thereof, wherein the curable silicone composition is according to claim 1.

* * * * *